Dec. 29, 1964 T. S. TEETOR 3,163,776
GATE CIRCUIT
Filed Feb. 16, 1961
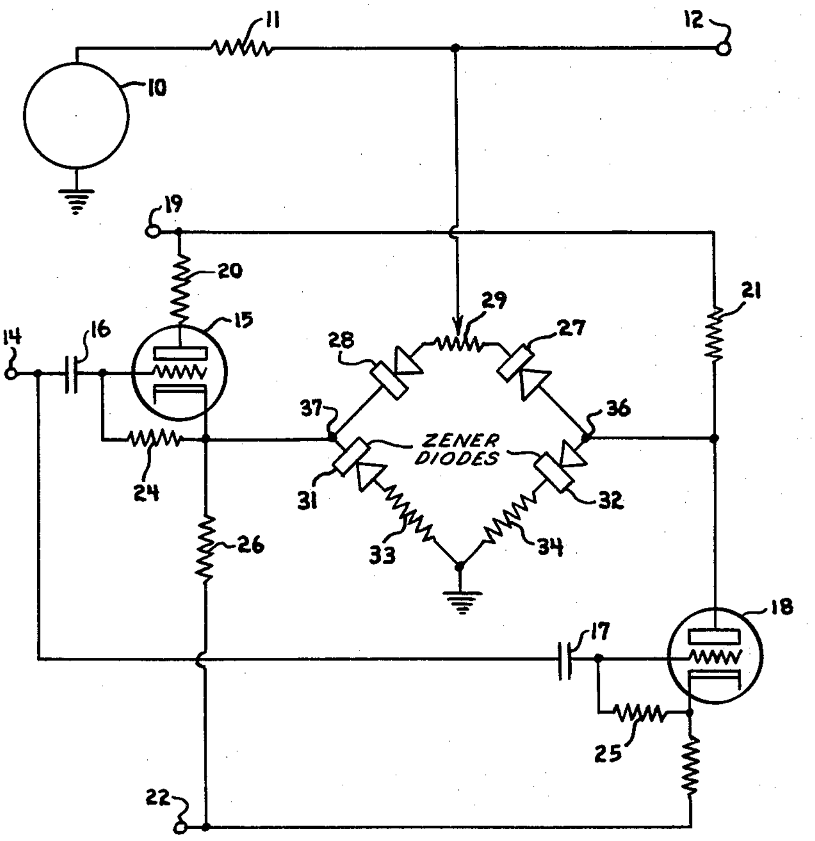
INVENTOR.
THOMAS S. TEETOR
BY
Lockwood, Woodard, Smith & Weikart
ATTORNEYS.

United States Patent Office 3,163,776
Patented Dec. 29, 1964

3,163,776
GATE CIRCUIT

Thomas S. Teetor, Fort Wayne, Ind., assignor to Magnavox Corporation, Fort Wayne, Ind., a corporation of Delaware Filed Feb. 16, 1961, Ser. No. 89,795
4 Claims. (Cl. 307—88.5)

This invention relates generally to electronic gate circuits and more particularly to such circuits incorporating seci-conductor diodes.

There are certain problems inherent in the use of semi-conductor diodes in gate circuits. For example, semi-conductor diodes have the undesirable characteristics referred to as "recovery spikes." This is a phenomenon associated with the nature of semi-conductor junctions and occurs when the diode is rapidly switched from the conducting to the non-conducting state.

According to one theory, the recovery spikes can be expected from considering the mechanism of conduction in a diode carrying high forward current. According to this theory, the important factor is carrier injection. High forward current in a diode corresponds to high injection, hence a high minority carrier concentration in a crystal. These injected carriers must be removed when a diode is pulsed in the reverse direction from a forward biased condition, resulting in a surge of back current. Thus the recovery spike occurs.

Some semi-conductors also have the disadvantage of relatively low reverse resistance. When, for example, a diode "bridge-type" gate is used in a high impedance circuit, the switching signal is added to and distorts the desired gate signal because of the effects of the reverse diode resistance and the signal source impedance as a summing network. This can be minimized by using the lowest permissible amplitude switching signal. However, the wave form of the switching signal must be accurately rectangular because of coupling effect. When signals of low repetition rate and asymmetric duty cycles are used, the rectangular wave form may be distorted because of a transformer or resistance-capacity coupling, thereby introducing objectionable errors. This problem may be minimized by utilizing direct coupling between the driving portion of the circuit and the chopper or gate portion of the circuit.

Distortion is also introduced by direct current drift. Complex balancing adjustments and drift compensating networks may be utilized for maintaining this problem but this invention obviates the need for such devices.

The principal object of this invention is to provide an electronic inhibitor gate circuit which is relatively insensitive to the repetition rate or duty cycle.

Another object of this invention is to provide in electronic gate circuits means for reducing error signals caused by "recovery spikes" and distortions resulting from wave forms which are not rectangular.

Still another object of this invention is to provide an electronic gate circuit for accomplishing efficient use of tube or transistor power. The circuit can be used equally well with transistor drivers.

In accordance with this invention there is provided an electronic gate circuit having zener type silicon diodes controlled by a pair of vacuum tube drivers.

The full nature of the invention will be understood from the accompanying drawings and the following description and claims.

The single figure of the drawing is a circuit diagram illustrating this invention.

Referring to the drawing this invention is intended to operate with a direct current signal source 10 connected in series with a resistor 11 and an output terminal 12 from which may be derived a gated D.-C. output signal.

A gating signal may be fed into a terminal 14 which is coupled to the control electrode of a driver 15 through a coupling capacitor 16. The driver may consist of a vacuum tube or a transistor. The gate signal is also coupled through a capacitor 17 to the control electrode of a driver 18 which also may be a vacuum tube or a transistor. Anode voltage is supplied to drivers 15 and 18 from a source 19 through load resistors 20 and 21 respectively. Cathode potentials for drivers 15 and 18 may be derived in conventional fashion from a source indicated at 22.

The driver 15 may have fixed bias, but it is preferred to provide a resistance capacity network consisting of capacitor 16 and resistor 24 having a time constant adapted to permit development of self bias due to grid conduction on the positive signal peaks.

Similarly, driver 18 is biased through the time constant network comprising capacitor 17 and resistor 25.

The gate circuit consists of a pair of diodes 27 and 28 coupled together by an adjustable resistor 29, the movable contact of which is connected to output terminal 12. Where a diode bridge is used in a shunt gate, the two upper diodes, such as 27 and 28 in the drawing, are sometimes referred to as the signal diodes. The lower two diodes are referred to as the switch diodes. According to the present invention, the switch diodes are a pair of Zener type silicon diodes 31 and 32 which are connected through resistors 33 and 34 to ground and are connected across diodes 27 and 28 at points 36 and 77. The junction point 37 is connected to the cathode of driver 15 while junction point 36 is connected to the anode of driver 18.

The Zener type diodes 31 and 32 are selected for the very sharp knee in the reverse voltage-current curve at the breakdown point. This type of diode exhibits extremely high resistance when biased in the reverse direction until the junction breaks down. The breakdown voltage value is known as the Zener point. Further increase of the applied voltage will result in a large current flowing through the diode in the reverse direction. This is because of the fact that Zener diodes have a very low dynamic resistance under applied voltages slightly higher than the Zener point voltage. When the reverse applied voltage is sufficient to operate the Zener diode at a minimum dynamic resistance within the power capability of the diode, a large current flow therethrough can be safely established. The condition of the Zener diode under this type of operation is known as saturation of the Zener diode. Diodes may be selected in the relatively low voltage ranges to very fine tolerances of Zener voltage. For example, diodes have been used having a Zener voltage of −8 plus or minus 1 percent.

Normally where diodes are used for gating, the reverse current is forced to flow through the high resistance of the reverse biased diode in shunt with its associated gate circuitry. When the open gate resistance is low, the developed voltage during the recovery time is small. However, in a shunt inhibitor gate, the ratio of open to closed gate resistance must be as high as possible. Thus, in the open condition, the diodes "see" a high resistance. It will be understood that in this description, the gate is said to be open when the signal to be gated is not allowed to pass through the gate. When the gate is closed, the signal is allowed to pass through the gate. The signal is, thereby shunted through the gate to ground.

In the usual shunt inhibitor diode gate, the voltage developed by the reverse current during recovery of the diode (recovery spike) is proportional to the reverse switching voltage applied to the diodes. Therefore, it is desirable to use as low a switching voltage as is allowed by the input signal. If the peak value of the input signal exceeds the gate bias and permits gate conduction in the "open" state, nonlinearity of the output signal will result.

In the balance "bridge-type" gate circuit, the recovery spike voltages of the signal diodes (27 and 28) are in phase opposition. It can be seen that if the two voltages are of equal amplitude and wave shape, no distortion of the signal will result. This is one of the things the Zener diodes employed according to the present invention accomplish.

In operation, a single-ended rectangular gating signal is applied to terminal 14 and simultaneously to the control electrode of drivers 15 and 18 through the time constant circuits 16–24 and 17–25. As previously stated, these networks permit development of self bias due to grid conduction on positive signals peaks. When the drivers 15 and 18 are non-conductive, the gate circuit 27 and 28, 31 and 32 is held closed by forward conduction of all four diodes 27, 28, 31 and 32 through resistors 26 and 21. In this condition, no direct current signal from source 10 appears at terminal 12. Resistors 33 and 34 serve as equalizing resistors for the different forward resistance of diode 31, 32 versus the forward resistance of diodes 27, 28. Resistor 29 serves as a balancing adjustment which compensates for inequality of forward resistance in diodes 27 and 28 and permits the signal "off" voltage to be adjusted to exactly zero. In this state the voltage at junction 37 is slightly negative and at junction 36 the voltage is slightly positive.

When the drivers 15 and 18 are conducting, in response to gating signals, there is a "gate open" condition wherein junction 37 becomes positive and junction 36 becomes negative whereby diodes 27 and 28 are cut off and present an extremely high resistance load to the signal. In this condition, the direct current signal is present at terminal 12.

The primary advantage of any direct-drive circuit for this type of gate lies in the insensitivity to duty cycle or repetition rate. Error signals due to "tilt" and "recovery spikes" are greatly reduced. The use of Zener diodes for 31 and 32, in conjunction with the direct drivers 15 and 18, essentially eliminates the spikes from the lower half of the bridge. It might be said that the diode limits its own spike by conducting at both extremes of voltage. Spikes are nearly impossible to eliminate completely, due to the high impedance presented to 27 and 28 by the signal circuit. They are minimized by the use of the fast recovery diodes.

The prime disadvantage of a direct drive circuit 15, 18 lies in its vulnerability to vacuum tube drift. Here again, the use of Zener diodes for 31 and 32 eliminates the problem. The Zener characteristic clamps the gate bias voltage at point 36 and 37 with the tolerance determined by diode selection thus balancing the reverse voltage applied to the signal diodes.

In the "gate open" condition, drivers 15 and 18 must conduct enough current through the resistors 26 and 21, respectively, to develop sufficient reverse voltage across the Zener diodes to attain saturation of the Zener diodes, plus some additional current to allow for tube aging. Component values are selected to achieve this result. With proper circuit design, any increase or decrease in tube current due to drift or aging will be absorbed by 31 and 32, while the gate bias remains constant. Accordingly with the Zener diodes in saturation, a low resistance ground return is provided for the signal diodes whenever the gate is closed, thus achieving balance of the bridge circuit.

Another advantage of the circuit is the efficient use of tube power. When the "gate open" duty cycle exceeds fifty percent, the positions of 15 and 18 may be reversed, permitting tube conduction only in the "gate closed" condition. This means that the tubes never need exceed a fifty percent duty cycle.

Additional gates may be operated in synchronism by connection to points 36 and 37. For example, if it is desired to gate another circuit simultaneously with the gating of the signal from signal source 10, the only parts which are required are the two signal diodes and series resistor for the second signal circuit which diodes can be connected to terminals 36 and 37 of the drawings in precisely the same manner as the signal diodes 27 and 28 illustrated. The connection of the additional signal diodes to the second signal source and second signal output terminal could be exactly the same as shown in the drawings for the first signal source 10 and output terminal 12. Accordingly, the present invention can be used to gate a number of different signal circuits simultaneously. All that is required is that a little more current be established by the drivers to assure satisfactory operation as the number of circuits gated is increased. It will be recognized that a substantial savings of components can be effected in this manner. For example, where the circuit is intended to gate two signal circuits, it can be accomplished with the one pair of Zener diodes, thus effecting a saving of two diodes per gate compared to a conventional system. The circuit provides signal switching and cross-talk rejection ratios in excess of 60 decibels.

The invention claimed is:

1. An electronic gating device comprising a source of gating signals, a pair of drivers having input circuits coupled to said source, a pair of diodes series connected between the output circuits of said drivers, a pair of Zener type diodes series connected across said pair of diodes, said drivers being arranged to respond to gating signals from said source for changing the direction of conduction of certain of said diodes.

2. An electronic gating device comprising a source of gating signals, a pair of drivers having output circuits and having input circuits coupled to said source, a pair of diodes series connected to the output circuits of said drivers, a pair of Zener type diodes series connected across said pair of diodes, said drivers being arranged to accommodate forward conduction in all of said diodes when said drivers are non-conductive and to become conductive in response to signals from said source and thereupon establish substantial reverse conduction in said Zener type diodes.

3. An electronic network comprising a source of direct current signals, a source of gating signals, a pair of drivers having output circuits and having signal input circuits coupled to said gating signal source, and a gate coupled to said direct current signal source and comprising a first pair of diodes series connected to the output circuits of said drivers, a pair of Zener diodes series connected across said pair of diodes, said drivers being arranged to accommodate forward conduction in all of said diodes to close said gate when said drivers are non-conductive and to become conductive in response to signals from said gating signal source and thereupon establish reverse current conduction in said Zener diodes and block said first pair of diodes for opening said gate.

4. An electronic network comprising a source of information signals, an information signal output terminal coupled to said source, a source of gating signals for gating information signals from said information signal source to said ouput terminal, a pair of drivers having output circuits and having input circuits coupled to said gating signal source, a gate coupled to said information signal source and to the output circuits of said drivers, said gate including a first diode and a Zener diode, said drivers being arranged to accommodate forward conduction in said diodes to close said gate when said drivers are non-conductive and to become conductive in response to signals from said gating signal source and thereupon establish reverse current conduction in said Zener diode and block said first diode for opening said gate.

References Cited in the file of this patent

UNITED STATES PATENTS

| | | |
|---|---|---|
| 2,936,338 | James et al. | May 10, 1960 |
| 2,987,577 | Faulkner | June 6, 1961 |
| 2,990,477 | MacIntyre | June 27, 1961 |